United States Patent [19]

Yang

[11] Patent Number: 5,360,750
[45] Date of Patent: Nov. 1, 1994

[54] METHOD OF FABRICATING LATERAL BIPOLAR TRANSISTORS

[75] Inventor: Sheng-Hsing Yang, Hsinchu, Taiwan, Prov. of China

[73] Assignee: United Microelectronics Corp., Hsinchu City, Taiwan, Prov. of China

[21] Appl. No.: 180,622

[22] Filed: Jan. 13, 1994

[51] Int. Cl.⁵ .......................................... H01L 21/265
[52] U.S. Cl. .................................. 437/31; 437/32; 437/55; 437/917; 437/27; 148/DIG. 96
[58] Field of Search .................... 437/31, 32, 55, 150, 437/151, 152, 153, 154, 27, 917; 148/DIG. 96

[56] References Cited

U.S. PATENT DOCUMENTS

| | | | |
|---|---|---|---|
| 3,919,005 | 11/1975 | Schinella et al. | 437/153 |
| 4,064,526 | 12/1977 | Tokumaru et al. | 437/150 |
| 4,110,126 | 8/1978 | Bergeron et al. | 437/32 |
| 4,120,707 | 10/1978 | Beasom | 437/150 |
| 4,956,305 | 9/1990 | Arndt | 437/32 |
| 4,966,858 | 10/1990 | Masquelies et al. | 437/150 |

Primary Examiner—Tom Thomas
Assistant Examiner—Tuan Nguyen
Attorney, Agent, or Firm—Ladas & Parry

[57] ABSTRACT

The present invention discloses a method for manufacturing lateral bipolar transistors of integrated circuits which have expanded collector regions, thereby raising the gain of the lateral bipolar transistors while reducing cycle time for manufacture. As a result, the performance of the transistors is improved and the cost of manufacture is reduced.

4 Claims, 8 Drawing Sheets

METHOD OF FABRICATING LATERAL BIPOLAR TRANSISTORS

BACKGROUND OF THE INVENTION

The present invention is directed to a method for manufacturing lateral bipolar transistors, and more particularly for manufacturing lateral bipolar transistors in an integrated circuit, exhibiting high gain and enjoying a relatively short manufacturing cycle time.

In the present state of art, methods for manufacturing lateral bipolar transistors in an integrated circuit have a shortcoming of a relatively long cycle time, i. e. the manufacturing time for a cycle is long. As a result, the manufacturing cost is increased by the long cycle time. The most important factor that leads to the long cycle time is the diffusing process, because diffusing takes more time than other processes. Moreover, lateral bipolar transistors made by conventional diffusing processes have relative low gain, which is generally not considered to be an advantage.

SUMMARY OF THE INVENTION

The primary object of the present invention is to provide a method for fabricating lateral bipolar transistors with relatively high gain.

Another object of the present invention is to provide a method for fabricating lateral bipolar transistors with a shorter cycle time, i. e., a shorter manufacturing time.

The objects of the present invention are fulfilled by providing a method for fabricating NPN lateral bipolar transistors on an N type substrate. The method comprises the steps of: (a) implanting P type impurity into a predetermined position of said substrate and driving the impurity in, to form a P well in said substrate; (b) implanting N type impurity into predetermined positions in the P well, to form N− expanded collector regions of said NPN transistors; (c) implanting P type impurity into predetermined positions in the P well, to form contact regions of base electrodes of said NPN transistors; (d) implanting N type impurity into predetermined positions in the P well and the N− expanded collector region, to form respective emitter electrodes and collector electrodes of said NPN transistors; (e) forming a field oxide layer over said NPN transistors; and (e) forming metal contacts at the contact regions of the base electrodes, the collector electrodes, and the emitter electrodes of said NPN transistors.

BRIEF DESCRIPTION OF THE FIGURES

The present invention will be more fully understood from the detailed description given hereinafter and the accompanying drawings which are given by way of illustration only, and thus are not limitative of the present invention and wherein.

DETAILED DESCRIPTION OF THE PREFERRED EMBODIMENT

FIGS. 1a to 1e show the first preferred embodiment of the present invention, which is applied to an N type substrate 1 to produce NPN lateral bipolar transistors. The method is described as follow:

STEP 1

Figure 1A:
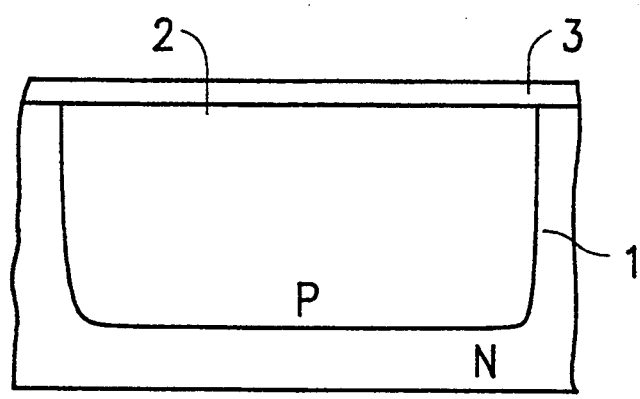
FIGS. 1a to 1e are cross sectional views showing a method of manufacturing NPN lateral bipolar transistors on an N type substrate according to the present invention.

As shown in FIG. 1a, a P well 2 is formed in the N type substrate 1. This step may be done by various conventional methods understood by those skilled in the field. For example, a photoresist (not shown in the figures) may be applied over the substrate 1 at first. The predetermined position for the P well in the photoresist is removed by conventional lithography technology. After that, P type impurity is implanted and driven into the substrate, to form the P well 2. An oxide layer 3 is grown driving in the impurity.

STEP 2

Figure 1B:
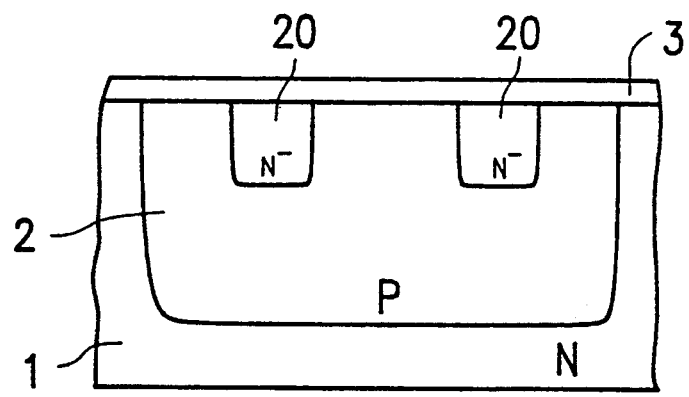

As shown in FIG. 1b, N type impurity is implanted into the P well 2, to form two N− expanded collector regions 20 using the same conventional lithography technology used in step 1.

STEP 3

Figure 1C:
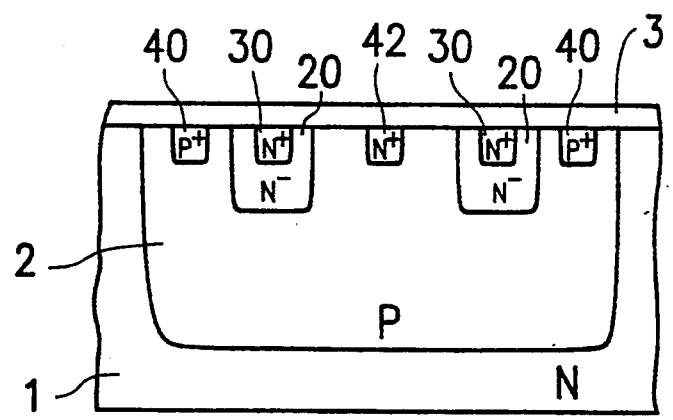

As shown in FIG. 1c, P type impurity is implanted into the P well 2, to form P+ contact regions 40. N type impurity is implanted into the P well 2 and the N− expanded collector regions 20, to form an N+ emitter electrode 42 in the P well 2 and N+ collector electrodes 30 in each N− expanded collector region 20. These two processes may use the same conventional lithography technology used in step 1. It does not matter whether the P type impurity or the N type impurity is implanted first.

STEP 4

Figure 1D:
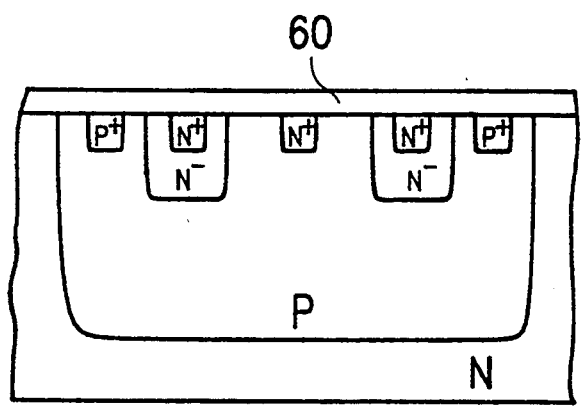

As shown in FIG. 1d, a field oxide layer 60 is formed by, for example, removing the oxide layer 3 shown in FIG. 1c and then thermally growing the oxide layer in a suitable oxidizing atmosphere.

STEP 5

Figure 1E:
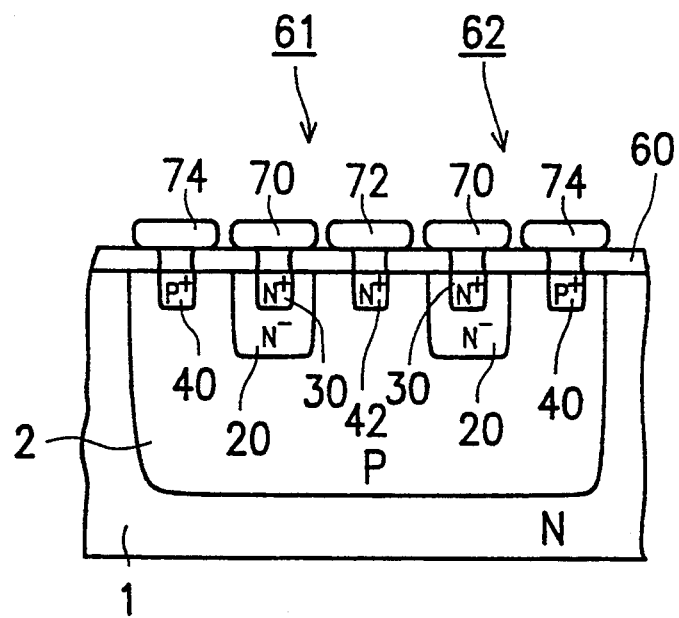

As shown in FIG. 1e, metal layers are deposited and patterned using conventional techniques to form metal contacts 70 of collector electrodes 30 of the NPN transistors 61 and 62, and the metal contacts 74 of base electrodes of the NPN transistors 61 and 62, and the metal contact 72 of the emitter electrode 42 of the NPN transistors 61 and 62. This is done by conventional deposition, lithography, and etching technology that is well understood by those skilled in the art.

A second preferred embodiment of the present invention, which is applied to an N type substrate 1 to produce PNP lateral bipolar transistors, is described hereinbelow. For convenience, similar elements are labeled with same numerals as that of the first embodiment. It should be noted that this method can also be applied to an N type epitaxial layer.

STEP 1

Figure 2A:
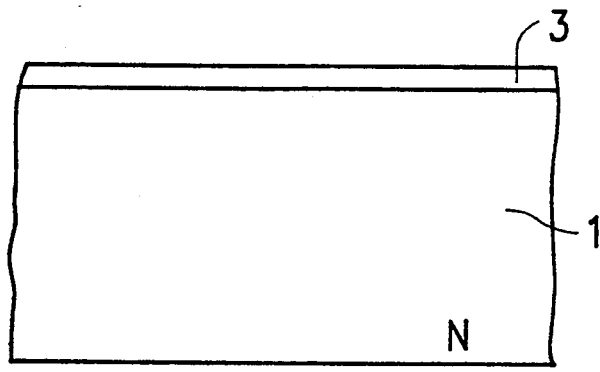
FIGS. 2a to 2e are cross sectional views showing a method of manufacturing PNP lateral bipolar transistors on an N type substrate according to the present invention.

As shown in FIG. 2a, an oxide layer 3 is grown on the N type substrate 1 by conventional technique such as thermal oxidation. However, this step is not necessary, and can be omitted if desired.

STEP 2

Figure 2B:
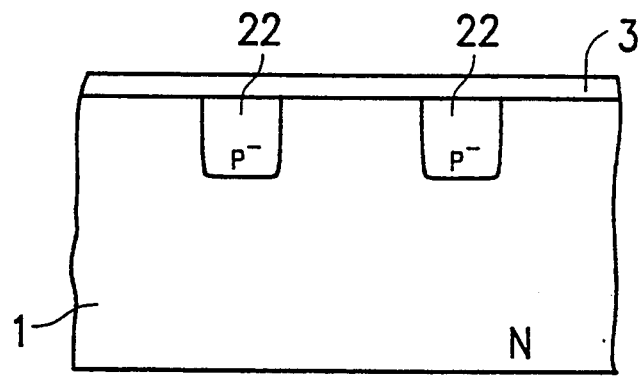

As shown in FIG. 2b, P type impurity is implanted into the N type substrate 1, to form two P− expanded collector regions 22 using conventional technology.

STEP 3

Figure 2C:
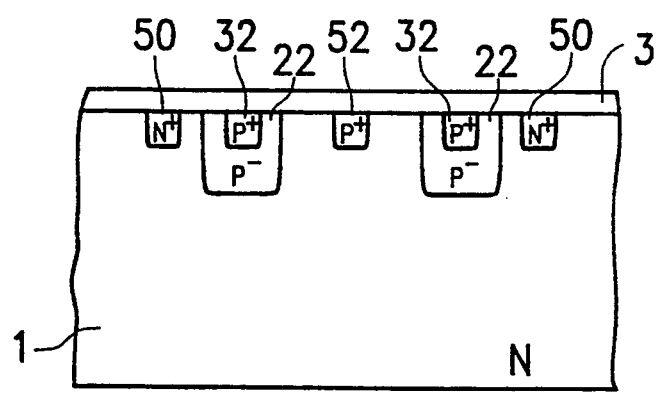

As shown in FIG. 2c, N type impurity is implanted into the N type substrate 1, to form N+ contact regions 50. P type impurity is implanted into the N type substrate 1 and the P− expanded collector regions 22, to form an P+ emitter electrode 52 and P+ collector electrodes 32 in each P− expanded collector region 22. These two processes uses the same lithography technology used in step 2. It does not matter whether the P type impurity or the N type impurity is implanted first.

STEP 4

Figure 2D:
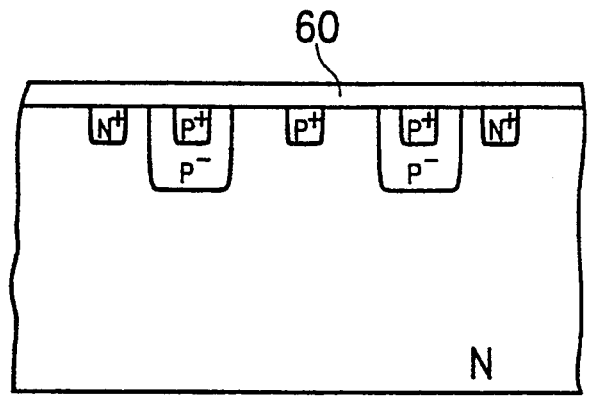

As shown in FIG. 2d, a field oxide layer 60 is formed by, for example, removing the oxide layer 3 shown in FIG. 1c and then thermally growing the oxide layer in a suitable oxidizing atmosphere.

STEP 5

Figure 2E:
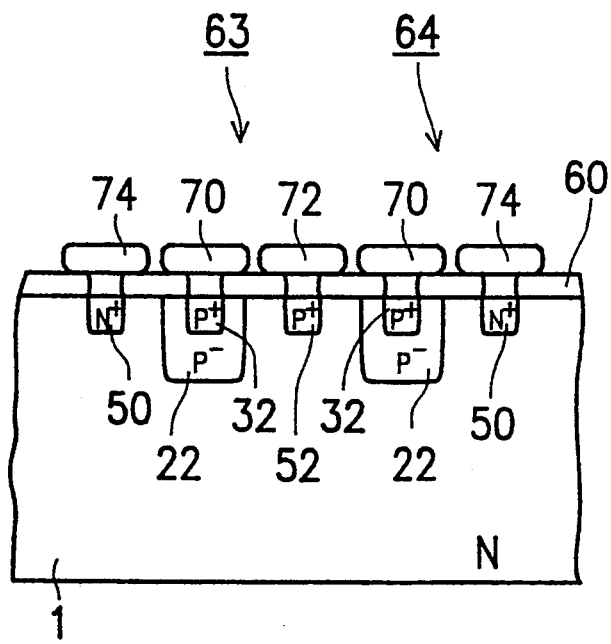
Figure 3A:
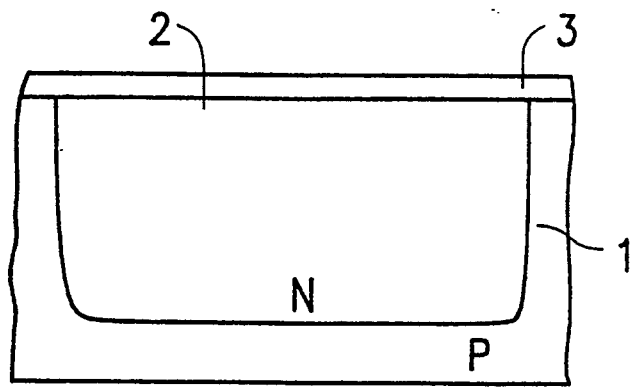
FIGS. 3a to 3e are cross sectional views showing a method of manufacturing PNP lateral bipolar transistors on an P type substrate according to the present invention.
Figure 3B:
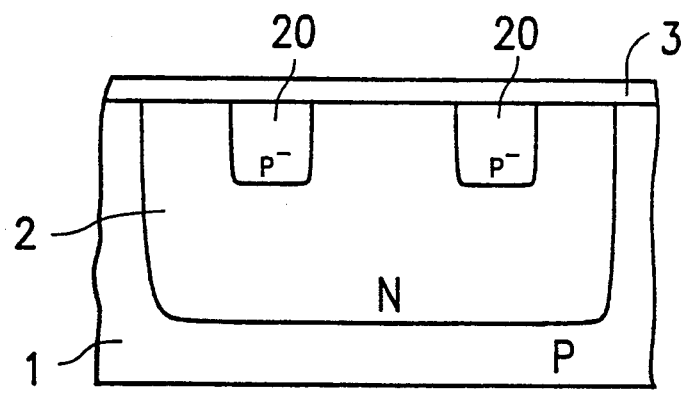
Figure 3C:
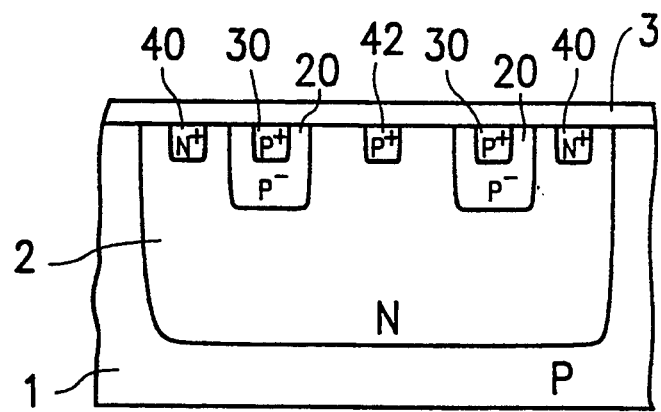
Figure 3D:
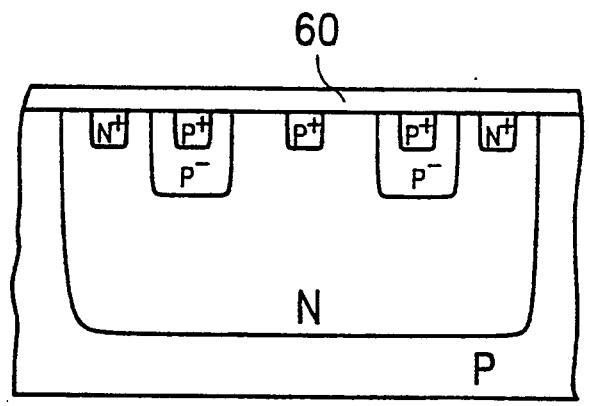
Figure 3E:
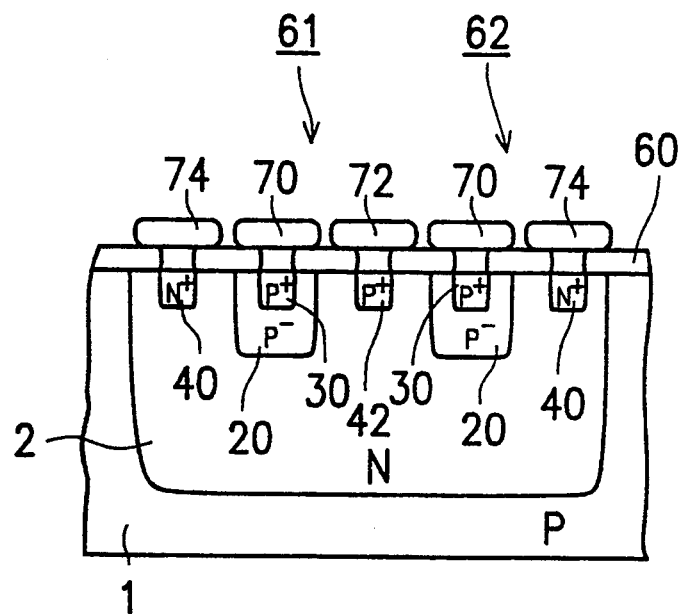
Figure 4A:
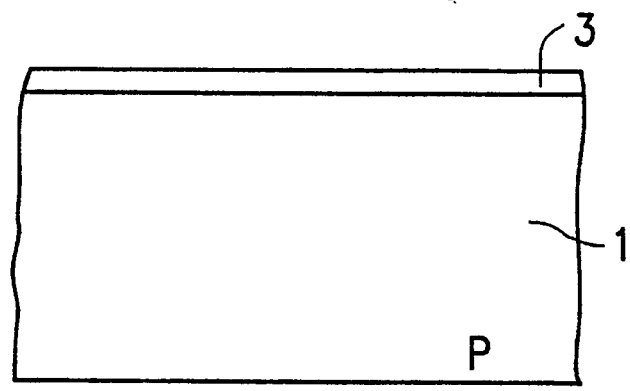
FIGS. 4a to 4e are cross sectional views showing a method of manufacturing NPN lateral bipolar transistors on an P type substrate according to the present invention.
Figure 4B:
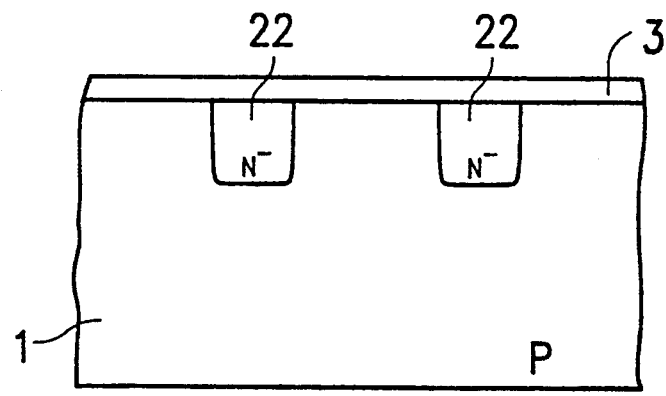
Figure 4C:
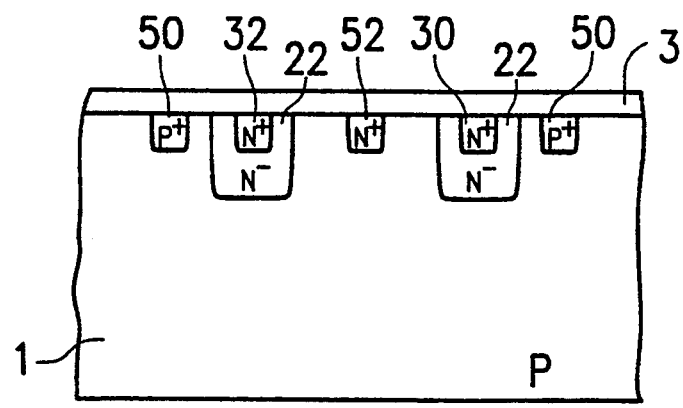
Figure 4D:
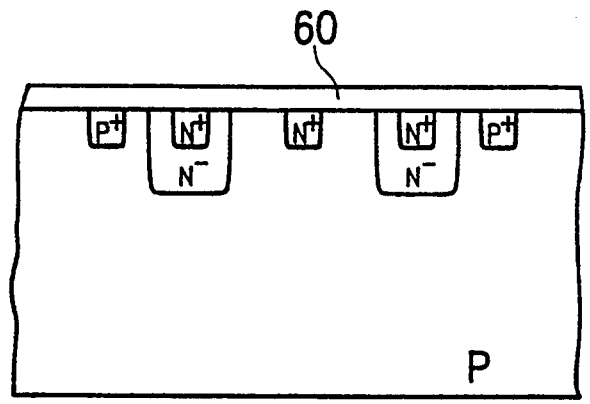
Figure 4E:
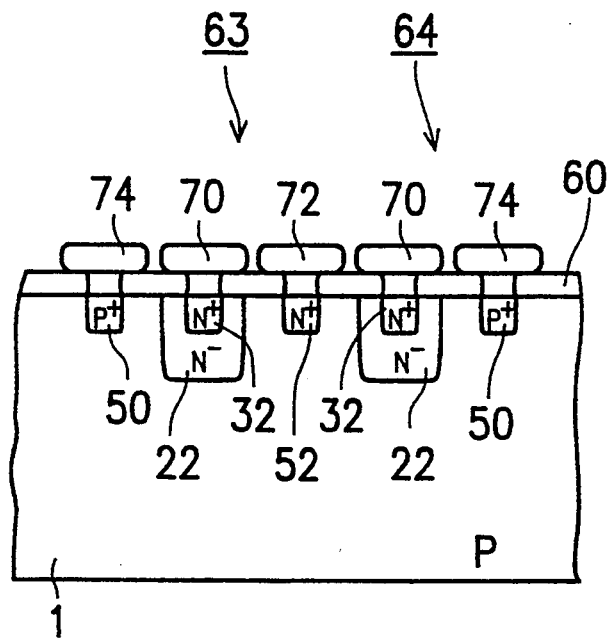

As shown in FIG. 2e, metal layers are deposited and patterned using conventional techniques to form metal contacts 70 of collector electrodes 32 of the PNP transistors 63 and 64, and the metal contacts 74 of base electrodes of the PNP transistors 63 and 64, and the metal contact 72 of the emitter electrode 52 of the PNP transistors 63 and 64. This is done by conventional deposition, lithography, and etching technology that is well understood by those skilled in the art.

Although not described in detail, it should be apparent to those skilled in the art that the methods can be applied to a P type substrate to produce PNP and NPN lateral bipolar transistors as shown in FIGS. 3a to 3e and FIGS. 4a to 4e.

As stated above, the NPN and PNP lateral bipolar transistors made according to the present invention have expanded collector regions, therefore the gain of the transistors is raised considerably, thus improving the performance of the transistors. Furthermore, because diffusion processes used in the conventional method are replaced by implantation processes, which take less time, the cycle time of the processes is reduced, therefore reducing the cost of manufacture.

While the invention has been described by way of examples and in terms of several preferred embodiments, it is to be understood that the invention need not be limited to the disclosed embodiment. On the contrary, it is intended to cover various modifications and similar arrangements included within the spirit and a scope of the appended claims, the scope of which should be accorded the broadest interpretation so as to encompass all such modifications and similar structures.

What is claimed is:

1. A method for fabricating NPN lateral bipolar transistors on an N type substrate, which comprises the following steps of:
    (a) implanting P type impurity into a predetermined position of said substrate and driving in, to form a P well in said substrate;
    (b) implanting N type impurity into predetermined positions in the P well, to form N− expanded collector regions of said NPN transistors;
    (c) implanting P type impurity into predetermined positions in the P well, to form contact regions of base electrode of said NPN transistors;
    (d) implanting N type impurity into predetermined positions in the P well and the N− expanded collector regions, to form emitter electrodes and collector electrodes of said NPN transistors respectively;
    (e) forming a field oxide layer over said NPN transistors; and
    (e) forming metal contacts at the contact regions of the base electrodes, the collector electrodes, and the emitter electrodes of said NPN transistors.

2. A method for fabricating PNP lateral bipolar transistors on an N type substrate, which comprises the following steps of:
    (a) implanting P type impurity into predetermined positions in said substrate, to form P− expanded collector regions of said PNP transistors;
    (b) implanting N type impurity into predetermined positions in said substrate, to form contact regions of base electrode of said PNP transistors;
    (c) implanting P type impurity into predetermined positions in said substrate and the P− expanded collector regions, to form emitter electrodes and collector electrodes of said PNP transistors respectively;
    (e) forming a field oxide layer over said PNP transistors; and
    (e) forming metal contacts at the contact regions of the base electrodes, the collector electrodes, and the emitter electrodes of said PNP transistors.

3. A method for fabricating PNP lateral bipolar transistors on an P type substrate, which comprises the following steps of:
    (a) implanting N type impurity into a predetermined position of said substrate and driving in, to form a N well in said substrate;
    (b) implanting P type impurity into predetermined positions in the N well, to form P− expanded collector regions of said PNP transistors;
    (c) implanting N type impurity into predetermined positions in the N well, to form contact regions of base electrode of said PNP transistors;
    (d) implanting P type impurity into predetermined positions in the N well and the P− expanded collector regions, to form emitter electrodes and collector electrodes of said PNP transistors respectively;
    (e) forming a field oxide layer over said PNP transistors; and
    (e) forming metal contacts at the contact regions of the base electrodes, the collector electrodes, and the emitter electrodes of said PNP transistors.

4. A method for fabricating NPN lateral bipolar transistors on an P type substrate, which comprises the 20 following steps of:
    (a) implanting N type impurity into predetermined positions in said substrate, to form N− expanded collector regions of said NPN transistors;

(b) implanting P type impurity into predetermined positions in said substrate, to form contact regions of base electrode of said NPN transistors;

(c) implanting N type impurity into predetermined positions in said substrate and the N⁻ expanded collector regions, to form emitter electrodes and collector electrodes of said NPN transistors respectively;

(e) forming a field oxide layer over said NPN transistors; and (e) forming metal contacts at the contact regions of the base electrodes, the collector electrodes, and the emitter electrodes of said NPN transistors.

* * * * *